United States Patent [19]

Kubo et al.

[11] Patent Number: 4,817,195
[45] Date of Patent: Mar. 28, 1989

[54] CHANNEL SELECTION APPARATUS HAVING AUTOMATIC FREQUENCY COMPENSATION FOR TRANSMISSION FREQUENCY ERROR

[75] Inventors: Kazuhiko Kubo; Akira Usui; Minoru Miyata; Hideyuki Ikuhara; Hiroyuki Nagai; Tadashi Yamada, all of Osaka, Japan

[73] Assignee: Matsushita Electric Industrial Co., Ltd., Japan

[21] Appl. No.: 137,148

[22] Filed: Dec. 23, 1987

[30] Foreign Application Priority Data

Dec. 24, 1986 [JP] Japan .................................. 61-313954

[51] Int. Cl.⁴ .......................... H04B 1/10; H04B 1/16
[52] U.S. Cl. .................................... 455/192; 455/182; 455/260; 358/195.1
[58] Field of Search ................ 455/179, 182, 183–186, 455/207, 209, 259, 260, 264, 314, 315, 316, 318, 192, 67, 226; 358/191.1, 195.1; 331/2, 10, 22, 31, 47–49

[56] References Cited

U.S. PATENT DOCUMENTS

| 4,365,349 | 12/1982 | Ogita et al. | 455/182 |
| 4,556,988 | 12/1985 | Yoshisato | 455/182 |
| 4,575,761 | 3/1986 | Carlson et al. | 358/195.1 |
| 4,581,643 | 4/1986 | Carlson | 358/195.1 |
| 4,627,100 | 12/1986 | Takano | 455/315 |
| 4,703,520 | 10/1987 | Rozanski, Jr. et al. | 455/260 |
| 4,727,591 | 2/1988 | Manlove | 455/182 |
| 4,731,871 | 3/1988 | Ishikawa | 455/260 |
| 4,731,874 | 3/1988 | Ichikawa | 455/182 |

Primary Examiner—Robert L. Griffin
Assistant Examiner—Curtis Kuntz
Attorney, Agent, or Firm—Lowe, Price, LeBlanc, Becker & Shur

[57] ABSTRACT

A channel selection apparatus having a double superhet tuner section (15) for converting one of a plurality of television channels contained in an input signal to a fixedly predetermined channel, includes an AFC circuit (11) for producing a frequency control voltage to execute closed-loop frequency control of the second local oscillator (5) of the tuner section while an AFC switch (16) is set in a first condition, whereas when the AFC switch is set in a second condition, a fixed frequency control voltage is applied to the second local oscillator and the frequency control voltage is applied to adjust the oscillation frequency of the first local oscillator (2) of the tuner section such as to compensate for any offset in the transmission frequency of a currently selected channel.

4 Claims, 4 Drawing Sheets

CHANNEL SELECTION APPARATUS HAVING AUTOMATIC FREQUENCY COMPENSATION FOR TRANSMISSION FREQUENCY ERROR

BACKGROUND OF THE INVENTION

The present invention relates to a channel selection apparatus for use as a cable television (referred to in the following as CAATV) converter, which utilizes a double superheterodyne (abbreviated in the following to double superhet) tuner circuit.

In recent years the up-down converter type of double superhet circuit has come into widespread use as the tuner circuit in CAATV converters. Such a CAATV converter functions to select one of a number of channel signals contained in an input signal, to be produced as a fixedly predetermined television channel signal which is supplied, for example, to a television receiver. The input signal is applied to an up-converter section which produces a first IF signal by heterodyning the input signal up to a higher frequency, and this first IF signal is supplied to a down-converter section to be converted to a second IF signal which is lower in frequency then the first IF signal. The up-converter section includes a first local oscillator whose frequency of oscillation is varied to execute selection of a required channel, while the down-converter section includes a second local oscillator whose frequency of oscillation is held fixed, irrespective of the selected channel.

With such a system it is generally necessary to employ a phase lock loop (abbreviated in the following to PLL) or automatic frequency control (abbreviated in the following to AFC) circuit to control the local oscillator frequencies, in order to ensure stability of the selected channel frequency.

An example of a prior art channel selection apparatus of the type described above is illustrated in FIG. 1, in which the portion 15 enclosed by a broken-line outline is a tuner section, formed of an up-down converter double superhet circuit. The tuner section includes an input filter 1, a first mixer 2 and a first local oscillator 7. An input signal containing a number of television channels as described above is transferred through the input filter 1 to be mixed in the first mixer 2 with a local oscillator signal produced from the first local oscillator 7, to be thereby converted to a first IF signal. This first IF signal is transferred through a band-pass filter 3 and then amplified in a first IF amplifier 4, which produces an output signal that is supplied to a second mixer 5. A second local oscillator 9 produces a local oscillator signal which is mixed with the first IF signal in the second mixer 5, to thereby convert the first IF signal to a second IF signal. The second IF signal is then amplified in a second IF amplifier 6, whose output (generally referred to as the video IF signal) is applied to an output terminal D. In this example, both the first local oscillator 7 and the second local oscillator 9 are voltage-control oscillators. Numeral 8 denotes a prescaler, which executes frequency division of the output signal from the first local oscillator 7. Numeral 10 denotes a VIF (video IF) amplifier, and 11 an automatic frequency control (AFC) circuit. Numeral 12 denotes a LPF (low pass filter), 13 denotes a PLL (phase lock loop) circuit, and 14 denotes a microcomputer.

The operation of this prior art channel selection apparatus is as follows. The video IF signal produced from the tuner section 15 is amplified in the video IF amplifier 10, and the resultant output signal from the video IF amplifier 10 is applied to the AFC circuit 11. The AFC circuit 11 thereby produces a frequency control voltage in accordance with the frequency of the video IF signal, which is supplied through an input terminal C of the tuner section 15 to control the frequency of oscillation of the second local oscillator 9. In this way, closed loop control is executed to stabilize the frequency of oscillation of the second local oscillator 9.

As stated above, the second local oscillator 9 is set at a fixed frequency of oscillation. However there is a possibility that this frequency will drift, ue to changes in temperature etc., by up to 500 KHz, for example, whereas it is necessary that the frequency of oscillation of the second local oscillator 9 be stable to within ±50 KHz. If the frequency of oscillation should depart from that range, changes such as generation of spurious beat components will occur in the video IF signal produced from the apparatus, which will affect the displayed television picture. For this reason it is preferable to employ an AFC loop to stabilize the frequency of oscillation of the second local oscillator 9 as described above.

The first local oscillator 7 on the other hand must have a capability for varying the frequency of oscillation thereof, in order to select various channels contained in the input signal. Such alteration of the frequency of oscillation of the first local oscillator 7, i.e. channel tuning operation, is executed by varying a control voltage which is applied to the input terminal A of the tuner section 15. Since the frequency of oscillation of the first local oscillator 7 is high, and the changes which are made in that frequency in order to execute channel selection are relatively large, a PLL circuit 13 is used to stabilize and to control changes in that frequency of oscillation. The output signal from the first local oscillator 7 is frequency divided in the pre-scaler 8, and the resultant frequency-divided signal is applied from terminal B of the tuner section 15 to the PLL circuit 13. Tuning data, to designate selection of a desired television channel, are produced from the microcomputer 14 in response to actuations of an input device such as a keyboard or a remote control unit (not shown in the drawings), and are transferred to the PLL circuit 13. The PLL circuit 13 contains a frequency divider which executes frequency division of the output signal from the pre-scaler 8 by a division ratio 1/n, with this frequency division ratio being determined by the tuning data from the microcomputer 14. The resultant frequency-divided signal is compared in the PLL circuit 13 with a reference frequency, to detect any deviation of the frequency-divided signal, and a detection signal representing such a deviation is transferred through the low-pass filter 12 to the input terminal A of the tuner section 15 and hence supplied to the first local oscillator 7 as a frequency control voltage. The frequency of oscillation of the first local oscillator 7, which is a voltage-control oscillator, is thereby controlled such as to compensate for the aforementioned frequency deviation, i.e. closed-loop control of the first local oscillator 7 is executed.

However in recent times it has become necessary to utilize such a channel selection apparatus for a variety of applications, including television games for example, as well as multi-channel CAATV operation, in which the transmission frequency of a television channel selected by the apparatus may have a significant offset from the standard frequency for that channel. In such a case, with for example an offset of 1 MHz, it is desirable that means be provided for automatically adjusting the frequency of the first local oscillator 7 by an amount which will compensate for the offset. This could be done in principle by detecting such a transmission frequency deviation, sending the resultant detection information to the microcomputer 14, and arranging that the microcomputer 14 commands the PLL circuit 13 to execute the requisite amount of change in the frequency of oscillation of the first local oscillator 7, e.g. with data sent from the microcomputer 14 causing the PLL circuit 13 to execute one or more step changes in the frequency of oscillation of the first local oscillator 7 such as to produce the offset compensation described above, so that follow-up control of the first local oscillator is performed.

This type of AFC operation will be further described referring to FIG. 2, which shows the AFC characteristic of the AFC circuit 11 in FIG. 1, i.e. the relationship between the frequency of the second IF signal applied from the video IF amplifier 10 and the resultant control voltage $V_c$ which is produced from the AFC circuit 11 and supplied to the second local oscillator 9. Assuming that both the first local oscillator 7 and the second local oscillator 9 are operating at the respective standard conditions for each of these for selecting a television channel of a specific transmission frequency, but that there is an offset of that transmission frequency from the standard frequency thereof, then the output voltage $V_c$ produced from the AFC circuit 11 might for example correspond to point 1 indicated on the characteristic of FIG. 2. The voltage range from $V_1$ to $V_2$ in FIG. 2 will be assumed to constitute a "window", within which the AFC circuit 11 can perform AFC operation to hold the second IF signal close to the standard value thereof, i.e. this represents the detection range for AFC control by the AFC circuit 11. Thus, if detection means were provided for indicating to the microcomputer 14 that the second IF signal frequency is outside this window range, it could be arranged that the microcomputer 14 will supply control data to the PLL circuit 13 whereby one or more step changes in frequency of the frequency of oscillation of the first local oscillator 7 (and hence of the frequency of the second IF signal) are executed, until the window range W is entered. When it is detected that the window range W has been entered (by the aforementioned detection means), then the microcomputer 14 could be notified accordingly, to thereby halt any further frequency stepping operations. Thus for the case of the control voltage $V_c$ being initially at position 1 in FIG. 2, a first step in frequency of the first local oscillator 7 would be executed to position 2, then (since the control voltage $V_c$ is still outside the window W) a second frequency step would be executed to bring the voltage $V_c$ to position 3, which is within the window W. Frequency stepping would then be terminated.

Thus if it were possible to utilize such a control voltage (i.e. from the AFC circuit which controls the second local oscillator frequency) for detecting when the transmission frequency has deviated from the standard value thereof, it would be possible for the converter to follow, i.e. to compensate for such a deviation. However in the prior art, this frequency control voltage is continuously applied to stabilize the frequency of oscillation of the second local oscillator, so that such compensation for a deviation of the transmission frequency is impossible to implement.

SUMMARY OF THE INVENTION

It is an objective of the present invention to overcome the problems of the prior art described above, by providing a channel selection apparatus whereby it is possible to apply local oscillator frequency control such as to detect and compensate for an offset of the transmission frequency of a received signal.

To achieve the above objective, a channel selection apparatus according to the present invention comprises:
  a tuner section comprising a first local oscillator having an frequency of oscillation variation capability and a fixed frequency second local oscillator, and producing a video IF signal as an output signal;
  an automatic frequency control circuit coupled to receive the video IF signal, for producing a frequency control voltage in accordance with frequency deviation of the video IF signal from a normal frequency thereof;
  a phase lock loop circuit for controlling the frequency of oscillation of the first local oscillator;
  an automatic frequency control switch, and
  changeover control means responsive to a first condition of the automatic frequency control switch for supplying the frequency control voltage from the automatic frequency control circuit to the second local oscillator, to control the frequency of oscillation thereof, and responsive to a second condition of the automatic frequency control switch for applying a predetermined fixed voltage to the second local oscillator for controlling the frequency of oscillation thereof to a fixed value and for applying the frequency control voltage from the automatic frequency control circuit to control the phase lock loop circuit such as to adjust the frequency of oscillation of the first local oscillator by an amount determined by the level of the frequency control voltage.

With a channel selection apparatus according to the present invention as set out above, with the AFC switch set in a first (i.e. normal) condition, an AFC control voltage produced from the AFC circuit is supplied to the second local oscillator, while when changeover of the AFC switch to a second condition thereof is executed, the AFC control voltage is supplied to a PLL circuit which includes the first local oscillator. In this condition in which the AFC control voltage is supplied to the PLL circuit, the second local oscillator is supplied with a fixed level of control voltage, and AFC control of the first local oscillator is executed to adjust the oscillation frequency thereof such that a deviation of the transmission frequency of the input signal received by the apparatus from the center value of that IF frequency is compensated. With the AFC switch set in its first condition, the AFC control voltage serves to stabilize the frequency of oscillation of the second local oscillator.

DESCRIPTION OF THE PREFERRED EMBODIMENTS

Figure 1:
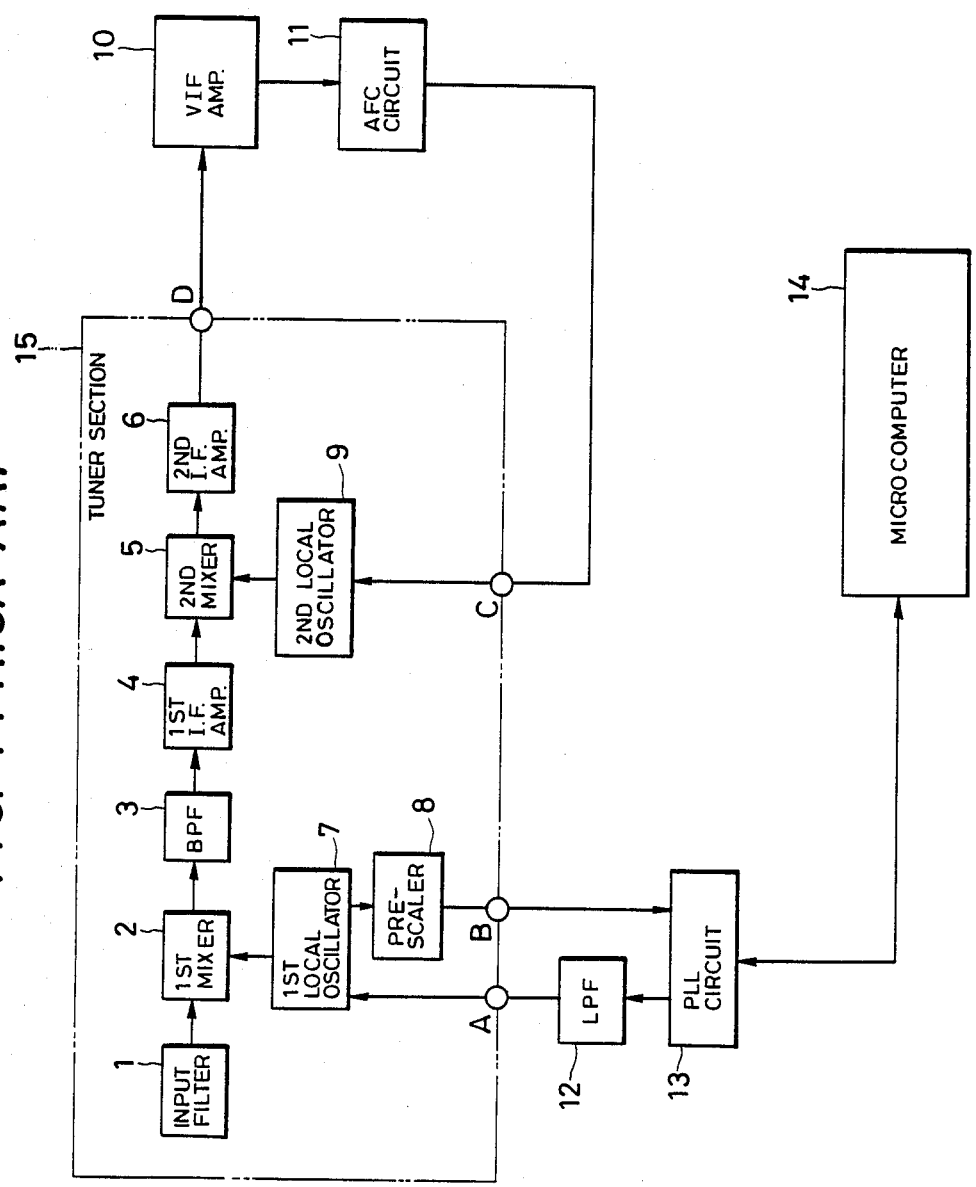
FIG. 1 is a block circuit diagram of an example of a prior art channel selection apparatus.
Figure 3:
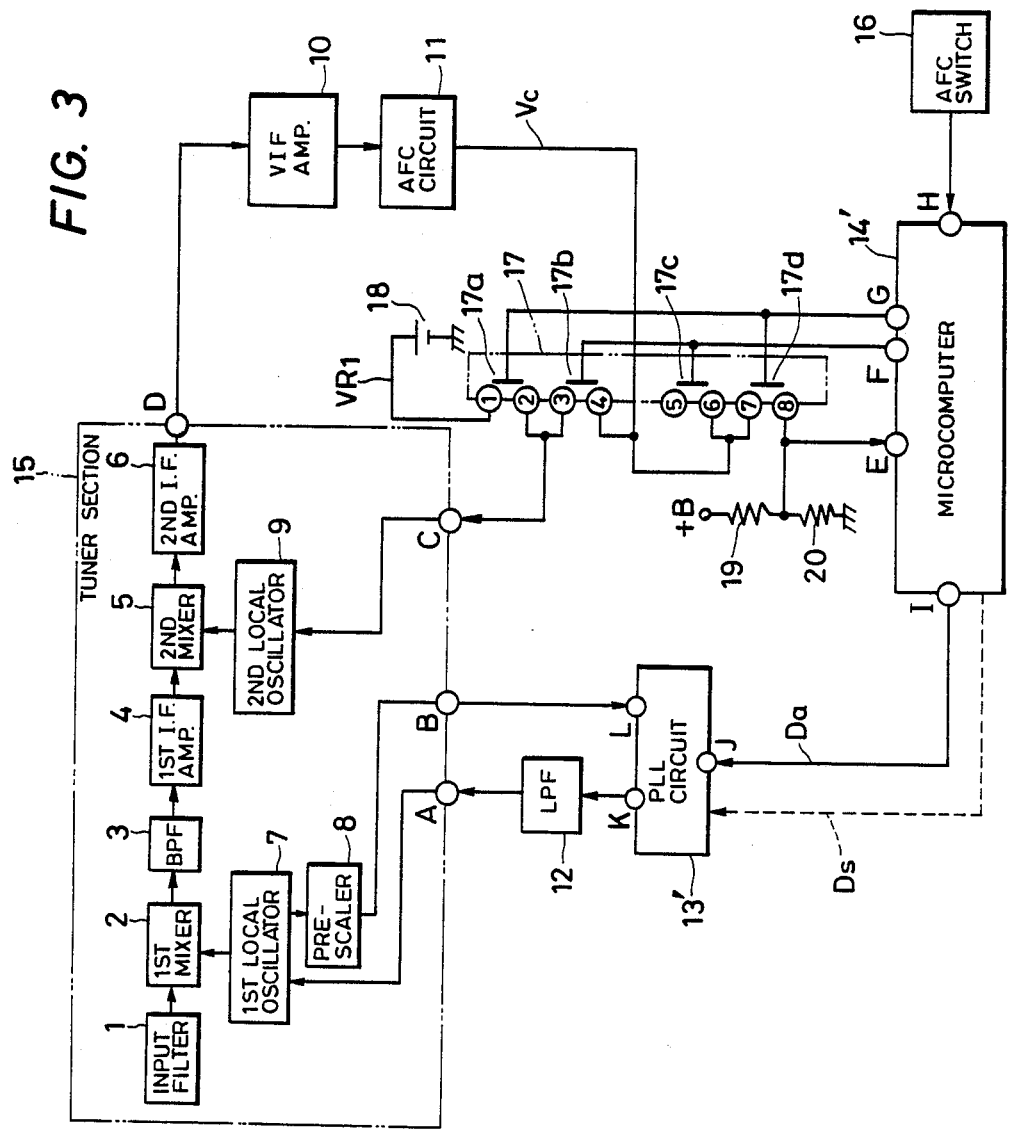
FIG. 3 is a block circuit diagram of an embodiment of a channel selection apparatus according to the present invention.

FIG. 3 shows an embodiment of a channel selection apparatus according to the present invention. In FIG. 1, circuit blocks corresponding to blocks in the prior art example of FIG. 1 are indicated by corresponding reference numerals, and further description of these will be omitted. The embodiment of FIG. 3 differs from the prior art example of FIG. 1 by including an AFC switch 16, an analog switch 17, a fixed voltage source 18, and a resistive voltage divider formed of resistors 19 and 20 connected between a potential +B and ground potential. Furthermore in the embodiment of FIG. 3, a PLL circuit 13' differs from the PLL circuit 13 of FIG. 13 by including an additional programmable frequency divider as described hereinafter, and a microcomputer 14' differs from the microcomputer 14 of FIG. 13 by including additional functions as described hereinafter.

The analog switch 17 is provided with a set of control electrodes 17a, 17b, 17c and 17d, which respectively selectively establish a closed or open circuit condition between pairs of switch contacts designated as a pair ①, ②, a pair ③, ④, a pair ⑤, ⑥ and a pair ⑦, ⑧ in accordance with logic level potentials applied to the electrodes 17a to 17c.

The voltage source 18 applies a reference voltage to the contact ① of switch 17, and the junction of resistors 19 and 20 is connected to contact ⑧. Contacts ② and ③ of switch 17 are connected in common to the second local oscillator 9, for supplying a frequency control voltage thereto. Contacts ④, ⑥ and ⑦ of switch 17 are coupled in common to receive a frequency control voltage $V_c$ produced from the AFC circuit 11, while contact ⑤ is unused.

Figure 4:
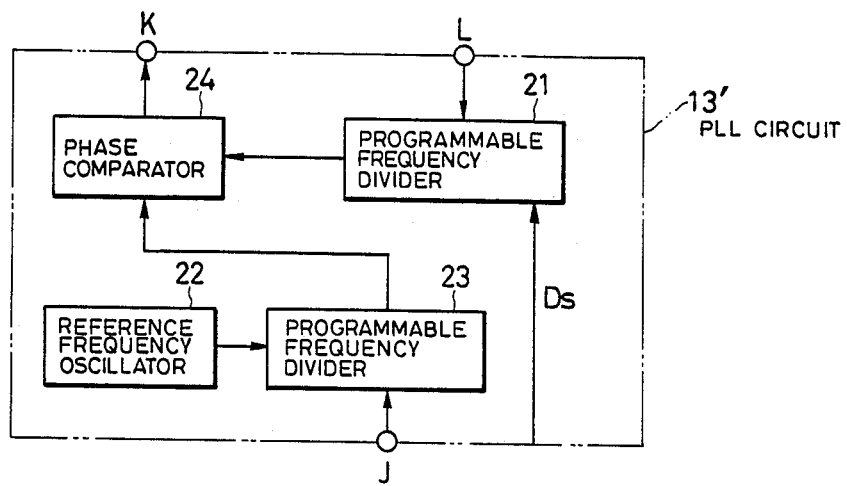
FIG. 4 is a block circuit diagram showing details of a PLL circuit in the embodiment of FIG. 3.
Figure 5:
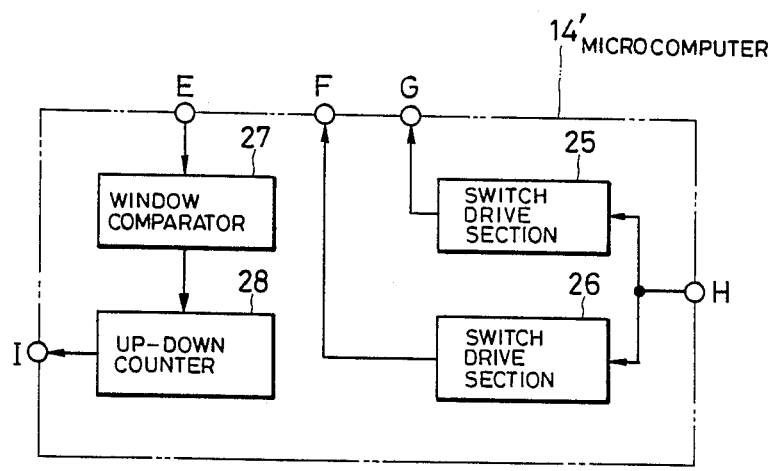
FIG. 5 is a functional block diagram of a microcomputer used in the embodiment of FIG. 3.

FIG. 4 shows details of the internal configuration of the PLL circuit 13', and FIG. 5 is a functional block diagram showing the specific features of the microcomputer 14' which are special to the present invention. In FIG. 4, numeral 21 denotes a first programmable frequency divider whose frequency division ratio is controlled by channel selection data $D_s$ supplied (via the broken-line path) from the microcomputer 14'. Numeral 22 denotes a reference frequency oscillator, 23 is a second programmable frequency divider for dividing the frequency of the reference signal produced from oscillator 22, and 24 denotes a phase comparator for comparing the frequency and phase of the output signal from the programmable frequency divider 21 with the output signal from the programmable frequency divider 23, to produce a phase comparison signal which is transferred to an output terminal K. The frequency division ratio of the programmable frequency divider 23 can be adjusted by frequency adjustment data $D_a$ which are transferred to an input terminal J from the microcomputer 14'. More specifically, the frequency adjustment data $D_a$ can produce step changes in the frequency division ratio of the programmable frequency divider 23, and hence result in corresponding step changes in the output from the phase comparison signal, which produce corresponding step changes in the frequency of oscillation of the first local oscillator 7.

In FIG. 5, 25 and 26 denote respective switching drive sections for applying control voltages from terminals F and G respectively to the electrodes 17a, 17d and electrodes 17b, 17c respectively of the analog switch 17, which determine the closed and open states of the corresponding switch contact pairs. A window comparator 27 serves to detect when the input voltage applied to a terminal E is above or below the window range W shown in FIG. 2. A control signal is thereby produced from the comparator 27 to indicate the result of this detection. An up-down counter 28 responds to this control signal from the window comparator 27 by incrementing or decrementing a count value therein, or holding the count value unchanged, in accordance with the status of that control signal. The frequency adjustment data $D_a$ applied from the up-down counter 28 to the PLL circuit 13' as described hereinafter, in accordance with up or down counting operation by the up-down counter 28.

It should be noted that only the functions of the microcomputer 14' which are novel to the present invention are described herein, and that various other functions are executed by the microcomputer 14' such as generation of channel selection data $D_s$ shown in FIG. 3, to be supplied to the programmable frequency divider 21 of the PLL circuit 13'.

The operation of this embodiment is as follows. It will first be assumed that the AFC switch 16 is set in a first condition, i.e. an OFF condition, whereby a specific logic level potential (assumed in the following to be the L level potential) is applied from the AFC switch 16 to an input terminal H of the microcomputer 14'. In response, the switch drive section 25 produces a control voltage at the L level from terminal G, while the switch drive section 26 produces a control voltage at the H level from output terminal F of the microcomputer 14'. As a result, a conducting condition is established between the contacts ③, ④ and between the contacts ⑤, ⑥, respectively, while an open circuit condition is established between the contacts ①, ② and between the contacts ⑦, ⑧ respectively. The control voltage $V_c$ produced from the AFC circuit 11 is thereby transferred through switch contacts ④, ③ the input terminal C of the tuner section 15, to control the frequency of oscillation of the second local oscillator 9. The frequency of oscillation of the second local oscillator 9 is thereby held stable. In addition, the voltage produced at the junction of resistors 19 and 20 is applied through terminal E of the microcomputer 14' to an input of the window comparator 27. That voltage is predetermined to be within the window range W shown in FIG. 2 and described above, so that no control signal is produced by the comparator 27 and hence no counting operations are executed by the up-down counter 28, and no change occurs in the data $D_a$ from the up-down counter 28 applied to the PLL circuit 13'.

It can thus be understood that in this condition the frequency of oscillation of the first local oscillator 7 is stabilized by a closed PLL control loop formed of the combination of the PLL circuit 13', the pre-scaler 8, and the low-pass filter 12, with the frequency division ratio of the programmable frequency divider 23 in the PLL circuit 13' being held fixed, and with the frequency division ratio of the programmable frequency divider 21 being determined by channel selection data $D_s$ supplied from the microcomputer 14'. In this condition, also, the frequency of oscillation of the first local oscillator 7 is held fixed until a channel selection operation is executed by varying the channel selection data $D_s$ supplied to the PLL circuit 13'.

The operation when the AFC switch 16 is set to the ON state is as follows. In this case an H level voltage is applied from the AFC switch 16 to the switch drive section 25 and the switch drive section 26 of the microcomputer 14′, As a result, the switch drive section 25 produces an H level control signal and the switch drive section 26 an L level control signal, whereby a conducting condition is established between contacts ①, ② and between contacts ⑦, ⑧ of the analog switch 17, and an open-circuit condition is established between contacts ③, ④ and between contacts 501⑤, ⑥. Thus, the AFC control voltage produced from the AFC circuit 11 is transferred through the contacts ⑦, ⑧ of the analog switch 17 to the input terminal E of the microcomputer 14′ and hence is applied to an input of the window comparator 27. In this condition, the resistors 19 and 20 are in effect connected in parallel across the frequency control voltage $V_c$, so that the effective gain of the AFC circuit 11 is modified, i.e. the frequency/voltage characteristic of that circuit (as seen from the input of comparator 27) is modified such that the rate of change of control voltage $V_c$ with respect to frequency changes is lowered. In addition, the reference voltage $VR_1$ from voltage source 18 is transferred as a frequency control voltage to the second local oscillator 9, whereby the frequency of oscillation of the second local oscillator 9 is held fixed at a predetermined nominal value, which is close to the center of the control range of the AFC circuit 11.

Figure 2:
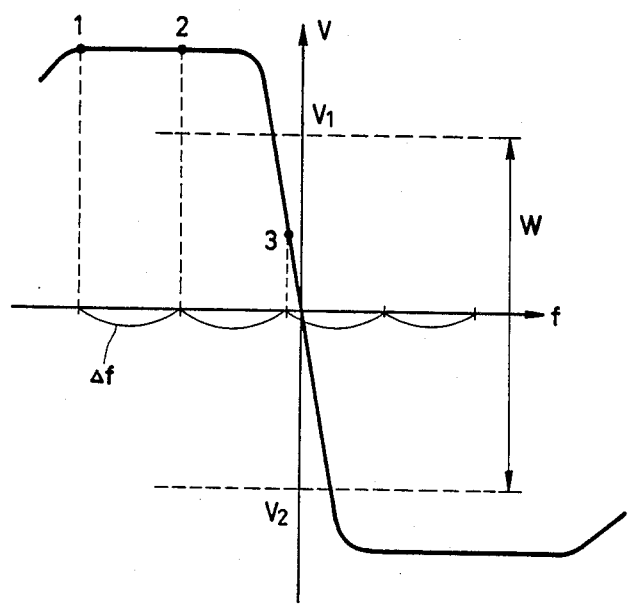
FIG. 2 shows an AFC characteristic of an AFC circuit in the example of FIG. 1.

If when the AFC switch 16 is set to the ON state the transmission frequency of the newly selected channel is substantially offset from the standard value of that frequency, then the frequency of the second IF signal from the second IF amplifier 6 will deviate substantially from the nominal value of that frequency, since the frequency of oscillation of the second local oscillator 9 is held fixed. That nominal value corresponds to the central value of the frequency f in the characteristic of FIG. 2, so that the control voltage $V_c$ from the AFC circuit 11 will be outside the window range W, i.e. will be higher than the value V1 or lower than the value V2 shown in FIG. 2. If the control voltage $V_c$ is higher than V1, then an output signal is applied from the window comparator 27 to the up-down counter 28 which initiates counting up by the up-down counter 28 of a clock signal (not shown in the drawings). Each time the count of the up-down counter 28 is incremented by a predetermined amount during this counting operation, the data $D_a$ applied from terminal I of the microcomputer 14′ to the programmable frequency divider 23 of the PLL circuit 13′ produces a step change in the frequency division ratio of the programmable frequency divider 23 such as to produce a corresponding change in the frequency of oscillation of the first local oscillator 7 which results in a step reduction in the second IF signal frequency, e.g. a step reduction Δf as indicated in FIG. 2. After one or more of these step frequency changes have been executed, the second IF signal frequency will be brought within the window range W, whereupon the output signal from the window comparator 27 terminates counting by the up-down counter 28, thereby causing the output data from the up-down counter 28 to terminate further step changes in the frequency of oscillation of the first local oscillator 7.

If on the other hand the control voltage $V_c$ is detected as being lower than the value V2 by the window comparator 27, then an output signal is applied from the window comparator 27 to the up-down counter 28 which initiates counting down by the up-down counter 28 of the aforementioned clock signal. Each time the count of the up-down counter 28 is thereby decremented by the aforementioned predetermined amount during this counting operation, the data $D_a$ from the microcomputer 14′ produces a step change in the frequency division ratio of the programmable frequency divider 23 such as to result in a step decrement of the second IF signal by the amount f. When the second IF signal frequency has thereby been brought within the window range W, these step changes in frequency are halted.

In this way, the frequency of oscillation of the first local oscillator is brought to a value which enables automatic frequency control of the second local oscillator to be initiated, i.e. follow-up control of the first local oscillator is performed such as to compensate for an offset in the transmission frequency of the selected channel.

During the above follow-up operation, the frequency of oscillation of the second local oscillator 9 is held at a fixed value by the voltage $VR_1$ applied from the reference voltage source 18. The level of $VR_1$ is made substantially identical to the center value of the control range of the AFC voltage $V_c$ produced from the AFC circuit 11 during normal AFC control of the second local oscillator 9. Thus, the frequency of oscillation of the second local oscillator 9 remains substantially unchanged when the AFC switch 16 condition is changed to the ON state to initiate the follow-up operation described above.

Upon completion of this frequency follow-up operation, the AFC switch 16 is returned to the OFF state thereof, whereupon the switch drive section 25 and switch drive section 26 of the microcomputer 14′ control the analog switch 17 such that an open-circuit is again established between the contacts of contact pair ①, ② and contact pair ⑦, ⑧, while a conducting condition is established between the contact pair ③, ④ and contact pair ⑤, ⑥. The control voltage $V_c$ from the AFC circuit 11 is thereby once more applied to control the frequency of oscillation of the second local oscillator 9 to thereby stabilize that frequency of oscillation by closed-loop control.

A time of approximately 200 mS is required from the point at which the AFC switch 16 is set in the ON state to begin controlling the PLL circuit 13′ in accordance with the control voltage $V_c$ from the AFC circuit 11 until the point at which the frequency follow-up operation described above is completed. It would be possible to control the changeover operations of the analog switch 17 based upon the output signal from the window comparator 27, i.e. to detect the completion of the frequency follow-up operation based on the level of that output signal and to control the analog switch 17 accordingly such as to return to AFC control of the second local oscillator 9. Alternatively, the system can be configured such that, after a time of 200 mS has elapsed following the initiation of frequency follow-up control of the 13′ by the control signal $V_c$, the analog switch 17 is automatically reset to restore AFC control of the second local oscillator 9 by signal $V_c$ (i.e. switch 16 is automatically returned to the OFF state).

The AFC switch 16 could be a switch which can be manually set in the ON state. However it is also possible to arrange that the AFC switch 16 is automatically set in the ON state at the time of a channel switching operation to select a new channel, and to thereafter remain in the ON state for a 200 mS interval, while being held in the OFF state at all other times.

With a channel selection apparatus according to the present invention as described above, having a double superhet type of tuner, a control voltage produced from an AFC circuit in accordance with the frequency of a video IF signal that is outputted from the tuner, is utilized to stabilize the frequency of oscillation of a second local oscillator of the tuner during normal operation. When necessary, e.g. at the time of a channel changeover operation, the AFC control voltage is utilized to adjust the frequency of oscillation of the first local oscillator of the tuner such as to compensate for any offset in the transmission frequency of the selected channel. Upon completion of this frequency compensation, control of the frequency of oscillation of the second local oscillator by the AFC control voltage is resumed. As a result, such a channel selection apparatus enables highly stable frequency control to be maintained during normal operation, while enabling a channel to be reliably selected and a satisfactory television picture derived therefrom, even if the transmission frequency of that channel deviates substantially from the nominal channel frequency.

What is claimed is:

1. A channel selection apparatus comprising:
   a tuner section comprising a first local oscillator having an oscillation frequency variation capability and a second local oscillator adapted to operate at an oscillation frequency close to a fixed predetermined value, and producing a video IF signal as an output signal;
   an automatic frequency control circuit coupled to receive the video IF signal, for producing a frequency control voltage in accordance with frequency deviation of the video IF signal from a normal frequency thereof;
   a phase lock loop circuit for controlling the frequency of oscillation of the first local oscillator;
   an automatic frequency control switch; and
   changeover control means responsive to a first condition of the automatic frequency control switch for supplying the frequency control voltage from the automatic frequency control circuit to the second local oscillator, to control the frequency of oscillation thereof, and responsive to a second condition of the automatic frequency control switch for applying a predetermined fixed voltage to the second local oscillator for controlling the frequency of oscillation thereof to a fixed value and for applying the frequency control voltage from the automatic frequency control circuit to control the phase lock loop circuit such as to adjust the frequency of oscillation of the first local oscillator by an amount determined by the level of the frequency control voltage.

2. A channel selection apparatus according to claim 1, whereby upon completion of an operation of controlling the frequency of oscillation of the first local oscillator in accordance with the frequency control voltage from the automatic frequency control circuit with the automatic frequency control switch set in the second condition thereof, changeover is automatically executed to again apply the frequency control voltage from the automatic frequency control circuit to adjust the frequency of oscillation of the second local oscillator.

3. A channel selection apparatus according to claim 1, whereby the automatic frequency control switch is set to the second state thereof at the time of a channel changeover operation, and is otherwise held in the first state thereof.

4. A channel selection apparatus according to claim 1, and further comprising resistor means adapted to be connected across the frequency control voltage from the automatic frequency control circuit by the changeover control means, for modifying a frequency response characteristic of the frequency control voltage while the frequency control voltage from the automatic frequency control circuit is applied to adjust the frequency of oscillation of the first local oscillator.

* * * * *